United States Patent [19]

Onodera et al.

[11] 4,364,112

[45] Dec. 14, 1982

[54] MINIATURE COMPUTER WITH SEPARATE HAND-HELD CONTROLLER

[75] Inventors: Toru Onodera, Kodaira; Akira Ohsawa, Higashimurayama; Hideki Nishino, Hino; Masao Watari, Tokyo, all of Japan

[73] Assignee: Hitachi, Ltd., Tokyo, Japan

[21] Appl. No.: 149,581

[22] Filed: May 14, 1980

Related U.S. Application Data

[62] Division of Ser. No. 898,996, Apr. 21, 1978, Pat. No. 4,253,143.

[30] Foreign Application Priority Data

Apr. 25, 1977 [JP] Japan .................................. 52-46845

[51] Int. Cl.³ .............................................. G06F 3/023
[52] U.S. Cl. .............................................................. 364/200
[58] Field of Search ... 364/200 MS File, 900 MS File

[56] References Cited

U.S. PATENT DOCUMENTS 3,200,379  8/1965  King et al. .......................... 364/200
3,760,375  9/1973  Irwin et al. .......................... 364/200
3,956,740  5/1976  Jones et al. .......................... 364/900
4,158,236  6/1979  Levy .................................... 364/900

Primary Examiner—Harvey E. Springborn
Attorney, Agent, or Firm—Antonelli, Terry and Wands

[57] ABSTRACT

A miniature computer has a main section which includes a central processor, a read only memory storing a monitor program, a random access memory for executing the monitor program and a controlling circuit for peripheral equipment, and a hand-held controller electrically connected to the main section through a flat cable, the hand-held controller having a keyboard and display device such that the keyboard has keys of numerals 0 to 9 and the alpha characters A to Z for enabling data in the form of symbolic language to be input according to an assembler program. The assembler program is stored in the read only memory and the symbolic language data is converted to corresponding machine language. The hand-held controller includes a key input system which utilizes encoders rather than mulitplexers to detect and transmit key input data data to the main section.

6 Claims, 15 Drawing Figures

MINIATURE COMPUTER WITH SEPARATE HAND-HELD CONTROLLER

This is a division of Application Ser. No. 898,996, filed Apr. 21, 1978, now U.S. Pat. No. 4,253,143.

BACKGROUND OF THE INVENTION

The present invention relates to a miniature computer. The miniature computer of the invention is defined in this specification as a computer in which at least the components, such as a central processing circuit, a main memory circuit, an auxiliary memory circuit and control circuits for peripheral equipment are mounted on a single printed substrate, while a control signal input device and display device are mounted on or outside of the printed substrate.

The known microcomputers generally referred to as "microcon" were adapted to be controlled by specific mechanical instruction signals, and had no adequate control circuit for peripheral equipment.

Consequently, the operators of these known microcomputers required a high degree of knowledge and had to pay close attention to computer operation. At the same time, since no suitable control circuit was available for the peripheral equipment, the use of the peripheral equipment was greatly restricted and, even if possible, required highly skilled operators trained in specialized operation techniques.

These microcomputers were usually provided with minimum functions which could meet the demand for a relatively wide range of versatility. Therefore, the user had to extend the system as required. However, the known microcomputers could not fully meet the demand for the expansion of the system.

SUMMARY OF THE INVENTION

It is therefore an object of the invention to provide a full-scale miniature computer which avoids the disadvantages of the prior art.

It is a further object of the invention to provide a miniature computer which can be equipped with a relatively inexpensive display device.

It is a still further object of the invention to provide a miniature computer provided with a miniaturized control input device.

It is a still further object of the invention to provide a miniaturized input device which is easy to operate.

It is a still further object of the invention to provide a miniature computer having a control input device with simplified circuitry.

To these ends, according to the invention, but not exclusively, there is provided a miniature computer which is constituted by a main computer section consisting of an LSI (large-scale semiconductor integrated circuit such as that sold by Hitachi, Ltd. under the name of HD46800) for a processor (central processing and controlling circuit) and peripheral LSIs (memory, I/O ports and so forth), and a pocketable console which corresponds to an I/O device separated from the main computer section and accommodated by a desk-top case.

The main computer section of the computer has a program memory for assembly language, so as to facilitate the program training of the user.

Hereinafter, this device will be referred to as a training module.

The training module is constituted by a main module section consisting of a single printed substrate as well as a pocketable console having a single display means and a plurality of key-tops built in a case similar to that of a desk-top calculator, the key-tops being connected to the main module section through a plurality of lines.

This training module is provided with a monitor and an assembler as the controlling program of the system, in the form of standard firmware, The operation of the training module is effected by key input through the aforementioned pocketable console. The response to the key input is displayed on an 8-segment 14-digit digitron display device, each digit having seven segments arranged in numerical form and a decimal-point display element.

The display signals, which are 14 at maximum, are so-called alphanumeric type signals consisting of the letters A to Z of the English alphabet, numerals and specific letters. According to this module, the assembling can be effected through confirming the input letters on the digitron display device, while inputting the source program through the keys on the console.

This training module includes an interface in its main section, so as to allow connection to a deck substantially identical to the tape decks which are commercially available as audio cassette decks. It is therefore possible to assemble the source program from a cassette tape, or to correct the content of the source tape.

These and other objects and advantageous features of the invention will become more clear from the following description of the preferred embodiments taken in conjunction with the accompanying drawings.

DESCRIPTION OF THE PREFERRED EMBODIMENTS

Figure 1:
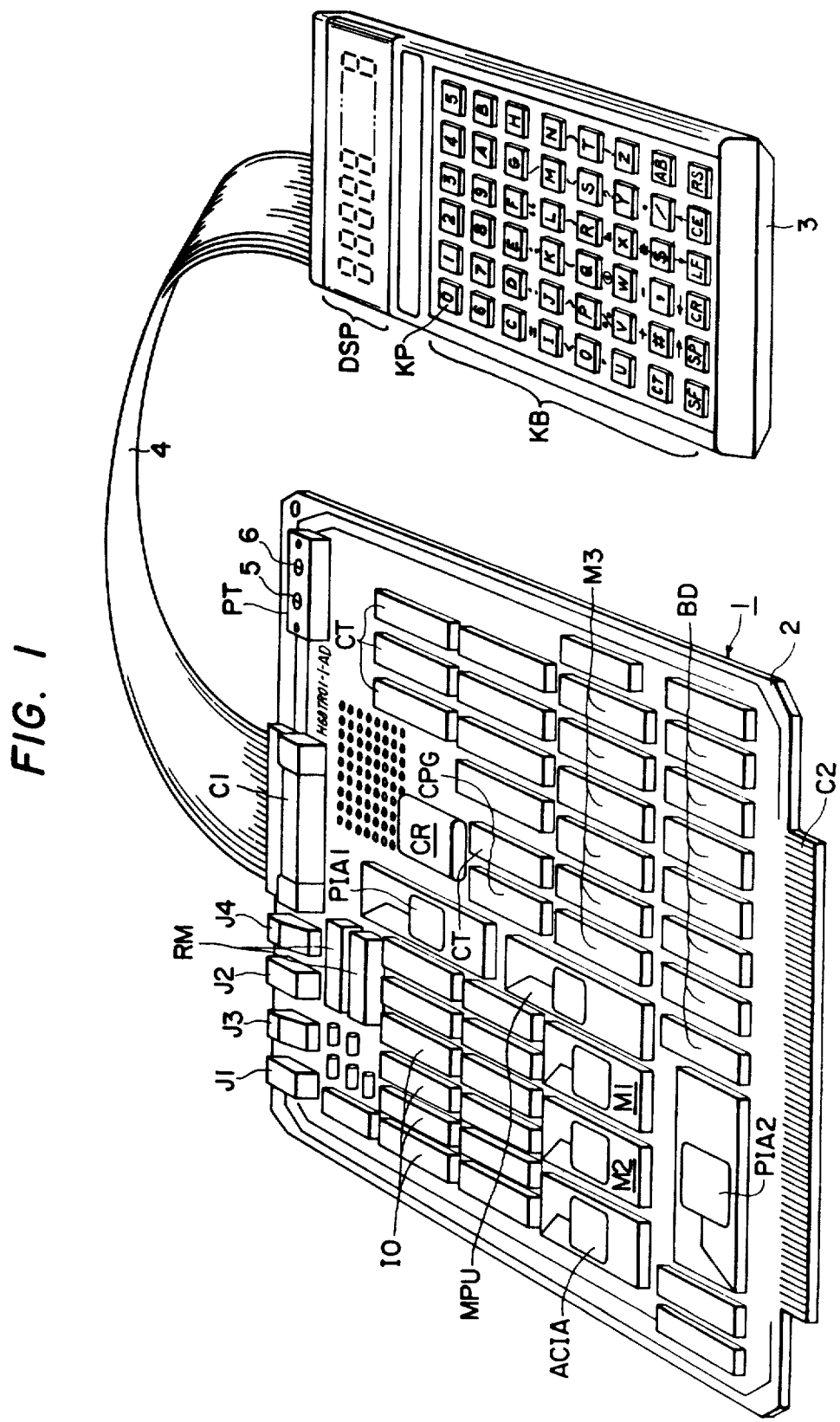
FIG. 1 is a perspective view of a miniature computer embodying the present invention.
Figure 2:
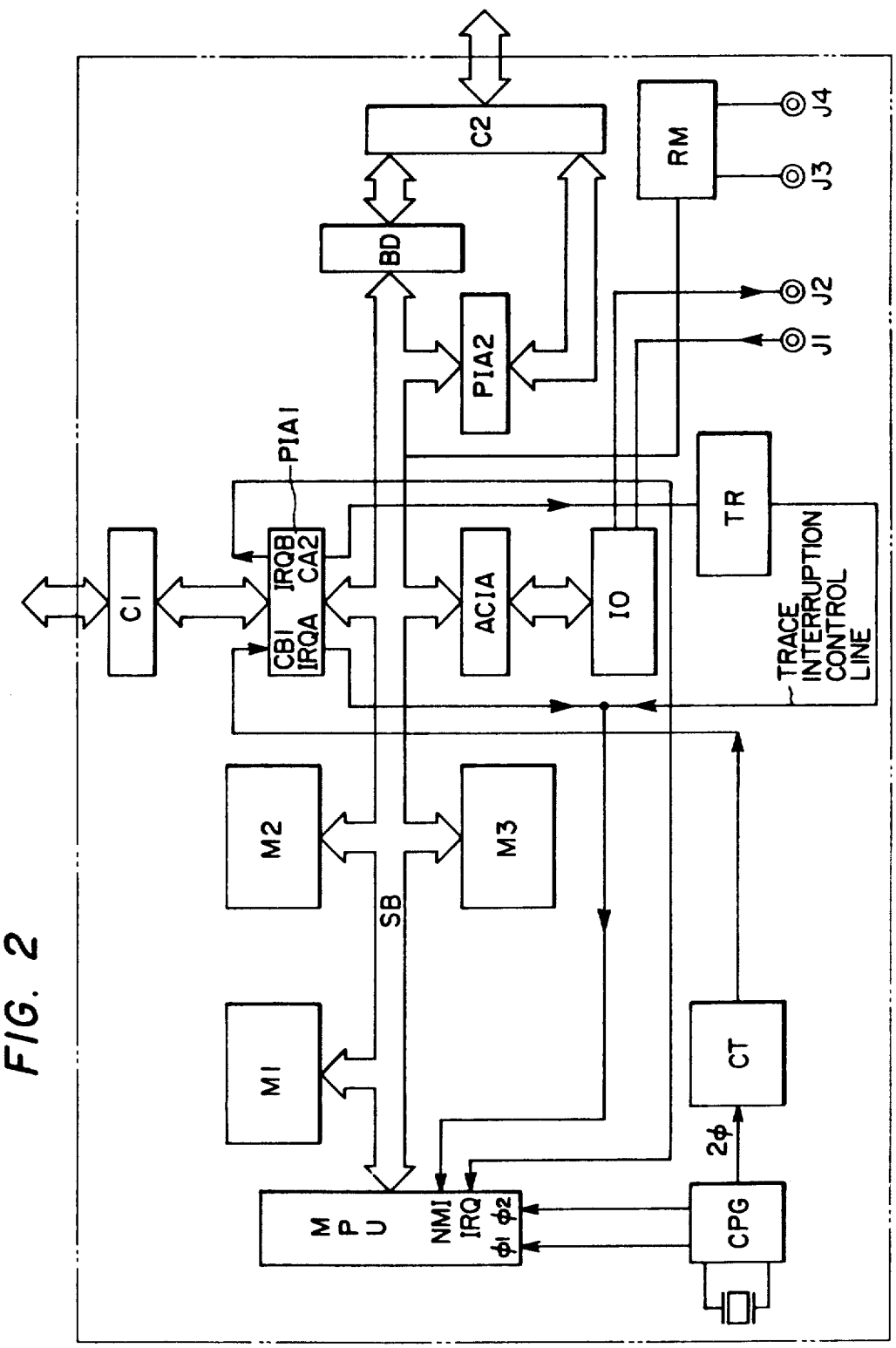
FIG. 2 is a block diagram of the main section of the miniature computer as shown in FIG. 1.
Figure 3:
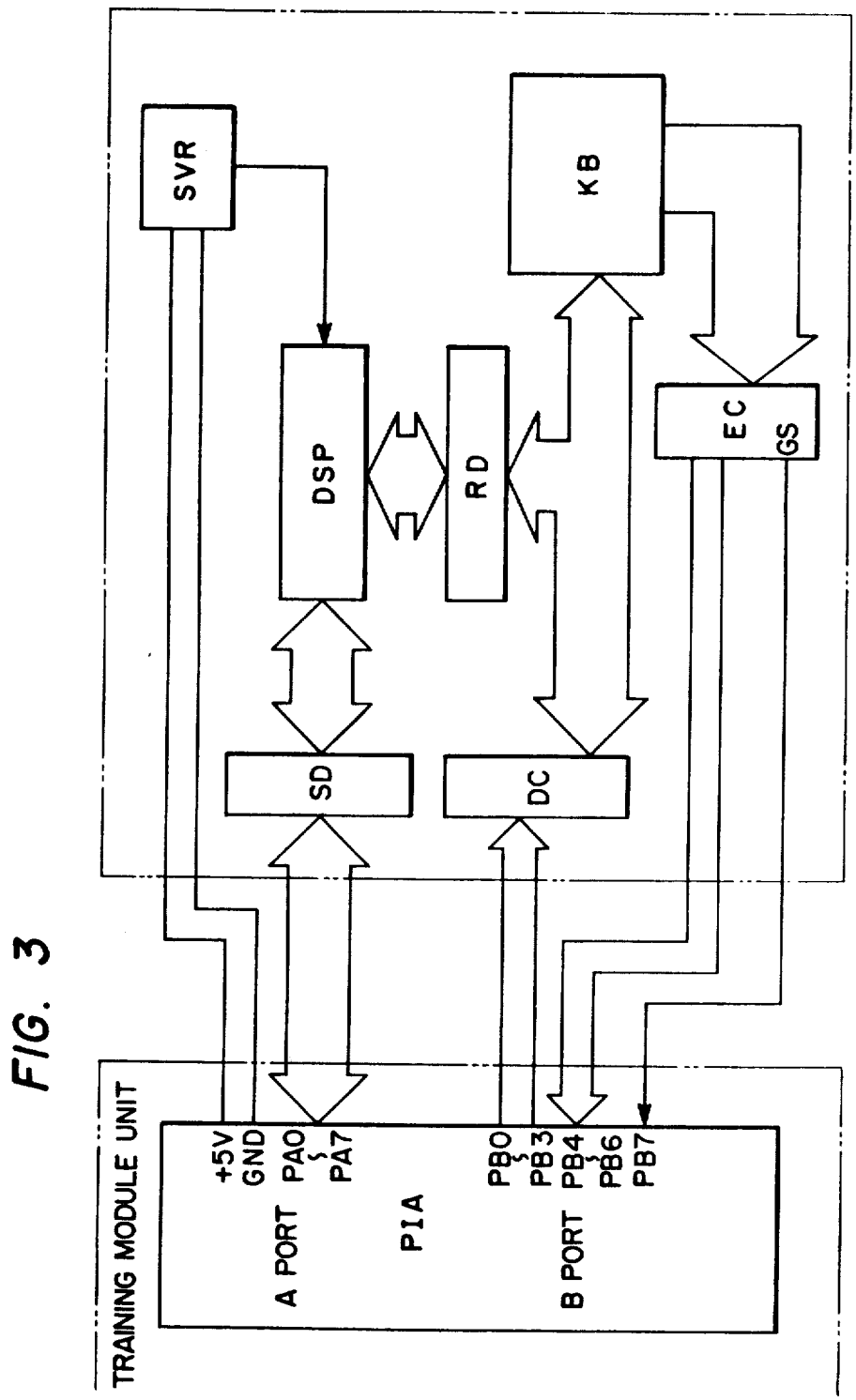
FIG. 3 is a block diagram of a console 3 of the miniature computer as shown in FIG. 1.

A training module in accordance with an embodiment of the invention will be described hereinafter. FIG. 1 shows a general view of the training module. The training module consists of a main module section 1 and a pocketable console 3 which is connected to the main section through a flat cable 4. The main part 1 of the module consists of an MPU (Micro Processing Unit), RAM (Random Access Memory) and so forth mounted on a printed substrate 2. FIGS. 2 and 3 show block diagrams of the main section 1 of the module and the pocketable console 3, respectively.

Referring to FIGS. 1 and 2, the MPU is a central processor constituted by an LSI, which is adapted to control the control circuits for peripheral equipment, as well as a number of memory circuits, in accordance with the machine instruction language delivered from the memory circuit which will be detailed hereinafter.

M1 denotes a ROM (Read Only Memory) of 32 K bits constituted by an LSI and adapted to function as a controlling memory circuit. This memory circuit M1 incorporates a monitor program and an assembly program as firmware. M2 is a RAM constituted by an LSI incorporating an N Channel-MOSFET of 128 bytes, and serves as a work area in executing the monitor program.

M3 denotes a —RAM consisting of 6 N-MOSLSI of 1 K×4 bits, and constitutes a program area for the user.

PIA1 is a parallel I/O (input/output) port composed of LSI's and is adapted to be used as an interface between the main section 1 and the pocketable console 3.

A 26-pin connector C1 is used for connecting the flat cable 4 leading from the pocketable console 3, to the main section 1. A serial I/O port ACIA composed of LSI's is adapted to connect a cassette tape deck interface circuit IO to a system bus. The system bus SB includes 16 address lines, 8 data lines, R/W (Read/Write) lines and so forth.

A modulation/demodulation circuit IO formed of LSIs is adapted to input the modulated information to a magnetic-tape recording means such as a cassette tape deck, and to demodulate the modulated recorded signal from the recording means. An LSI CPG constitutes an oscillation circuit for generating clock signals, while CR denotes the quartz oscillator of the oscillation circuit.

A frequency-dividing circuit CT formed of counters constructed from LSI's is adapted to produce a clock signal (1.2 KHz) for the timer interruption and clock signals (1.2 KHz, 2.4 KHz and 4.8 KHz) which are used in writing information in the cassette tape deck. TR denotes a 1-instruction trace interruption generating circuit, adapted to perform an NMI (Non Maskable interruption) in the MPU. A tri-state BUS driver BD formed by an LSI is adapted to produce signals having logical values 1,0 and, in the third state, accepts signals having logical values 1,0. Since this driver is bi-directional with respect to the signal, it is used as a bi-directional bus-driver for connecting an expanded system to the address BUS and data BUS of the main section 1, when such an expanded system is required.

A parallel I/O port PIA2 formed by an LSI is adapted to be used by the operator through a terminal C2 of the printed substrate.

RM denotes a remote control circuit for remotely controlling the start/stop motion of the cassette tape deck.

As will be understood from FIG. 1, a pair of those remote control circuits are mounted on the printed substrate, so as to control the start/stop motions of two cassette decks.

A 100-pin connector C2 constituted by the printed substrate 2 is adapted to be inserted into a receptacle connector of the card cage, when the system is expanded.

$J_1$ and $J_2$ denote jacks for applying input signals to the tape deck and outputting signals from the same, respectively.

A jack $J_3$ is provided for remotely controlling the tape deck corresponding to the jack $J_1$, while $J_4$ is a jack for remotely controlling the tape deck corresponding to the Jack $J_2$.

A power terminal assembly PT attached to the printed substrate 2 has a + terminal 5 and a − terminal 6.

Turning now to the blocks of the pocketable console 3, a segment driver SD adapted to drive a display unit DSP in accordance with the display segment pattern signal transferred through 8 (eight) signal lines PAO to PA7 from the parallel I/OPA1.

The display unit consists of a 14-digit 8-segment light-emitting display having 7 display segments arranged in numerical form and a decimal point display segment.

A 4-16 line decoder DC is adapted to decode display digit information consisting of parallel 4 bits at the 4 (four) signal lines PBO to PB3 leading from the parallel I/O port PIA1, and performs a selection of display digits as well as production of 6 rows of scanning signals KB of a key board KB. A display digit select driver RD is provided for each digit of the display tube, and is adapted to drive a corresponding digit of the display tube upon receipt of a digit selection signal from the aforementioned decoder DC.

The aforementioned key board KB is a 6×8 key board matrix and has, although not shown, 8 (eight) row conductors and 6 (six) column conductors. Contacts are provided at the points where these row and column conductors intersect, for connecting them to each other by means of a key top. The 6 column conductors are connected to corresponding ones of the 6 output lines of the decoder DC.

An 8-encoder EC is adapted to encode column information from 8 column lines of the key board KB, and output a 3-bit key encode signal and a 1-bit key operation display signal. These signals of 4 bits are transferred to the output terminals PB4 to PB6 and PB7 of the parallel I/O port PIA1.

SVR denotes a switching voltage regulator which constitutes the power source (27) for the light-emitting display unit.

This training module has the following advantageous features.

(1) Since the assembler is firm-wared to the 32 K bit mask ROM M1 on a single substrate 2, it is possible to directly turn to the assembling without the need to affect a loading of the assembler paper tape as used in the conventional microcomputer. Further, thanks to the assembler constituted by the ROM MI, the source program input from the key of the pocketable console 3 can be directly input, as an object program, to the RAM memory.

Therefore, the labor for the program conversion is completely eliminated. Further, thanks to the use of symbolic language, program inputting and debugging are highly simplified and facilitated.

(2) The console 3 is mechanically separated from the main section 1 and is connected to the same electrically by means of the flat cable 4. The flat cable 4 consists of a plurality of parallel conductors fixed unitarily by an insulating material made of plastic and is therefore flexible. Thus, the console 3 can be freely moved relative to the main section 1. Further, the console is mounted in a case which is similar to that of the known desk-top type electronic calculator. Because of these features, the console 3 can be manipulated and handled efficiently and conveniently, even in the hand of the operator.

Further, this console 3 can be designed for key input of alphametric letters similar to those of existing teletype consoles, and is less expensive as compared with a tele-typewriter.

As will be seen from FIG. 1, as well as the foregoing description, the console 3 further has display tubes (or elements) for 14 digits provided in the same case. Thus, the input signals are displayed conveniently in close proximity to the inputting keys. This display unit further displays, when monitoring, the information of the content of the main section 1. Consequently, the input information is easily confirmed and checked in relation with the key operation.

(3) Specific arrangement of the controlling circuits and jacks on the same printed substrate allows the use of two cassette tape decks, which may be of the type commercially available as audio cassette tape decks, specifically for the purpose of reading and writing, respectively. Alternatively, one audio cassette deck can be used as an auxiliary memory.

Further, a programmed control of the start/stop operation of the audio cassette deck can be obtained by suitably making use of a microphone remote control terminal on the cassette tape deck. Thus, it is possible to use the cassette tape decks in the similar manner to the magnetic memory device of large-scale computers.

(4) Because of the connector $C_2$ on the main section of the training module, the expansion of the system can easily be carried out by simply inserting the main section and the expanding board into the card cage.

The card cage is designed to allow the insertion of 4 (four) cards (substrates) and has a construction to connect these cards by means of a common bus. A RAM memory expanding board, FDC (Flopy Disc Control) board, DMAC (Direct Memory Access Control) board, CRTC (Cathode Ray Tube Control) board and so forth can conveniently be used as the expanding board. These boards incorporate HTP (Highspeed Tape Puncher) interface, PTR (Paper Tape Reader) interface, TTY (Teletype) interface and so forth.

Figure 4:
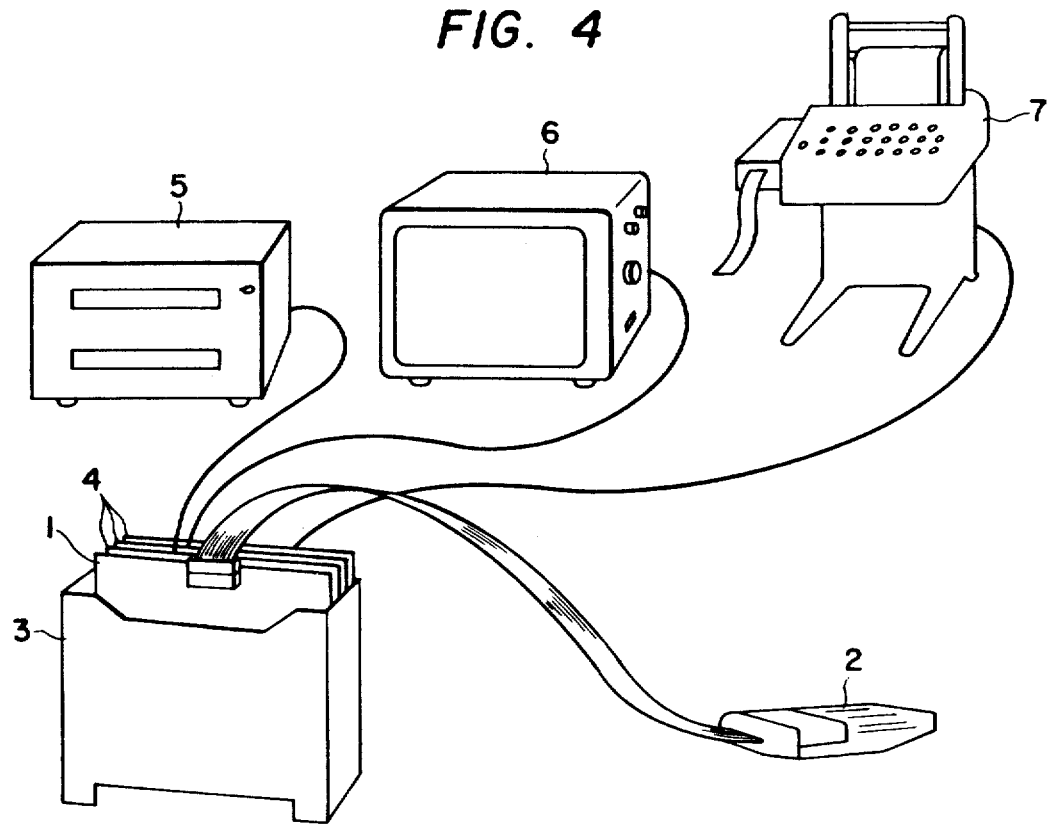
FIG. 4 shows the concept of an example of application of the miniature computer.

FIG. 4 shows an example of the expanded system.

The training module 1 and the expansion board or boards 4 are inserted into the card cage 30. Pocketable console 3, floppy disc drive 5, television 6 and a tele-typewriter 7 are connected to the module 1. (5) A terminal PT for the connection to the power supply is provided on the printed substrate 2, independently of the connectors $C_1$ and $C_2$. This arrangement allows the sole use of the main part 1 and the console 3, as shown in FIG. 1, without necessitating an expensive receptacle for mating such a multi-pin connector as $C_2$.

As stated before, jacks for an audio cassette deck, which is to be used as an auxiliary memory, are mounted on the printed substrate 2, so that the remote control of the cassette deck may be effected through these jacks.

In the prior-art microcomputer, when it incorporates an audio cassette deck as an auxiliary memory, it has been necessary to manipulate the button or key of the microcomputer simultaneously with the manipulation of the cassette tape deck, taking the start and stop timings of the cassette deck into consideration.

However, according to the invention, such troublesome work is eliminated owing to the adoption of the remote control.

One of the critical features of the invention resides in an efficient use of the microphone remote control terminal provided on the audio cassette deck, such that the switching of the latter is effected by a lead relay switch.

Since the lead relay switch is electrically insulated from other circuits in the printed substrate, and since it does not limit the direction of electric current therethrough, the start/stop switching of the audio cassette deck is possible irrespective of the voltage level and polarity of the driving motor of the audio cassette deck.

Further, the programmed control of the start/stop motions allows the data to be stored in the form of separate blocks on the magnetic tape of the audio cassette deck.

Figure 5:
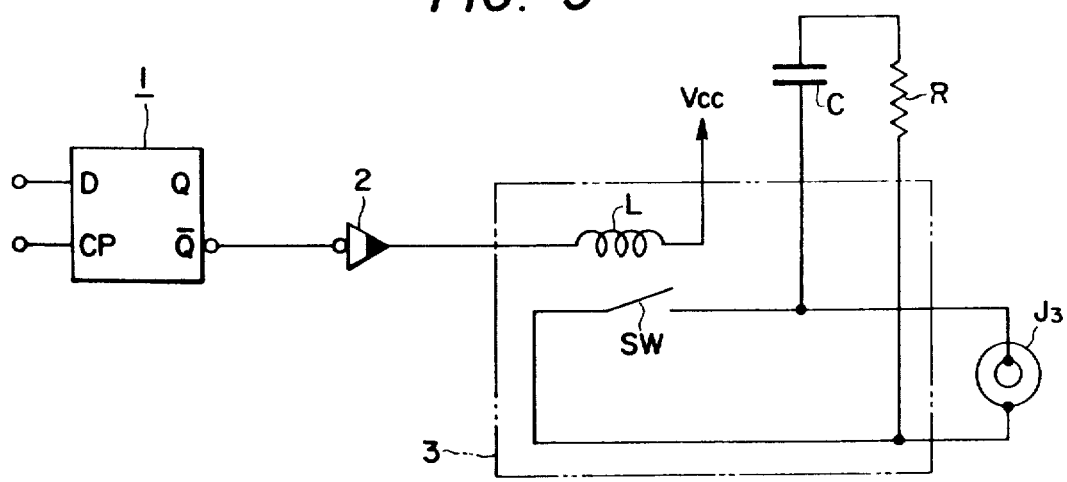
FIG. 5 is a circuit diagram of a remote control circuit.

FIG. 5 shows in detail the structure of a controlling circuit RM for effecting the start/stop motion control of the tape deck.

It will be seen from FIG. 5 that a contact SW of the lead relay is connected in parallel with the aforementioned Jack $J_3$. The operation of the mechanism for turning the switch on and off is as follows.

A coil L of the lead relay 3 is driven by an inverter 20 which functions as a buffer-amplifying circuit. The inverter 20 is adapted to be driven by the output $\overline{Q}$ from a D-type edge trigger flip-flop 1.

Signals representative of the start/stop condition are input to a data input terminal D of the flip-flop 10, while a clock terminal CP of the same is adapted to receive a timing signal for determining the timing of the start/stop switching.

Consequently, when a pulse rises up at the clock terminal CP while the terminal D is receiving a high level signal, the output signal $\overline{Q}$ at the output terminal comes to assume the higher level, so that the input signal to the coil L of the lead relay 33 is turned to the lower level by the inverter 20. The switch SW is kept in "OFF" state during this condition.

On the other hand, when the signal applied to the clock terminal CP rises while the signal applied to the input terminal D is assuming the lower level, the switch SW is turned to the "ON" state.

Thus, according to the invention, the key-input from the console 3 is delivered to the main part 1, by means of a reduced number of lines, without using complicated circuits for generating specific signals.

Conventionally, in order to make a key code by a depression of a key of a key matrix (consists of X line and Y line), a scanning is first effected on the Y lines, while keeping all of the X lines at the state of logical "O", in such a manner as to successively select the multiplexers (with decoders) connected to the Y lines thereby, making use of the fact that the multiplexer outputs logical "O" when the Y line corresponding to the depressed key is selected. This select information (Y line information) is stored and input to the multiplexer. Subsequently, the X lines are selected until the logical "O" is obtained. Finally, a key code is worked out from the stored select information (Y line information) and the select information (X line information) which makes the output of the multiplexer "O" in X line scanning.

This conventional method of working out the key code inconveniently requires a complicated circuit structure because of independent or separate selection of information of the X and Y lines. Further, the working out of the key code from two pieces of select information by means of computer software, i.e. the processing by a computer, requires complicated software.

According to the key-input system of the pocketable console of the training module in accordance with the invention, the Y lines, which are connected in conventional system to the multiplexers, are connected to encoders in lieu of the multiplexers, so as to diminish the required scale of the hardware, as well as that of the software.

Figure 6:
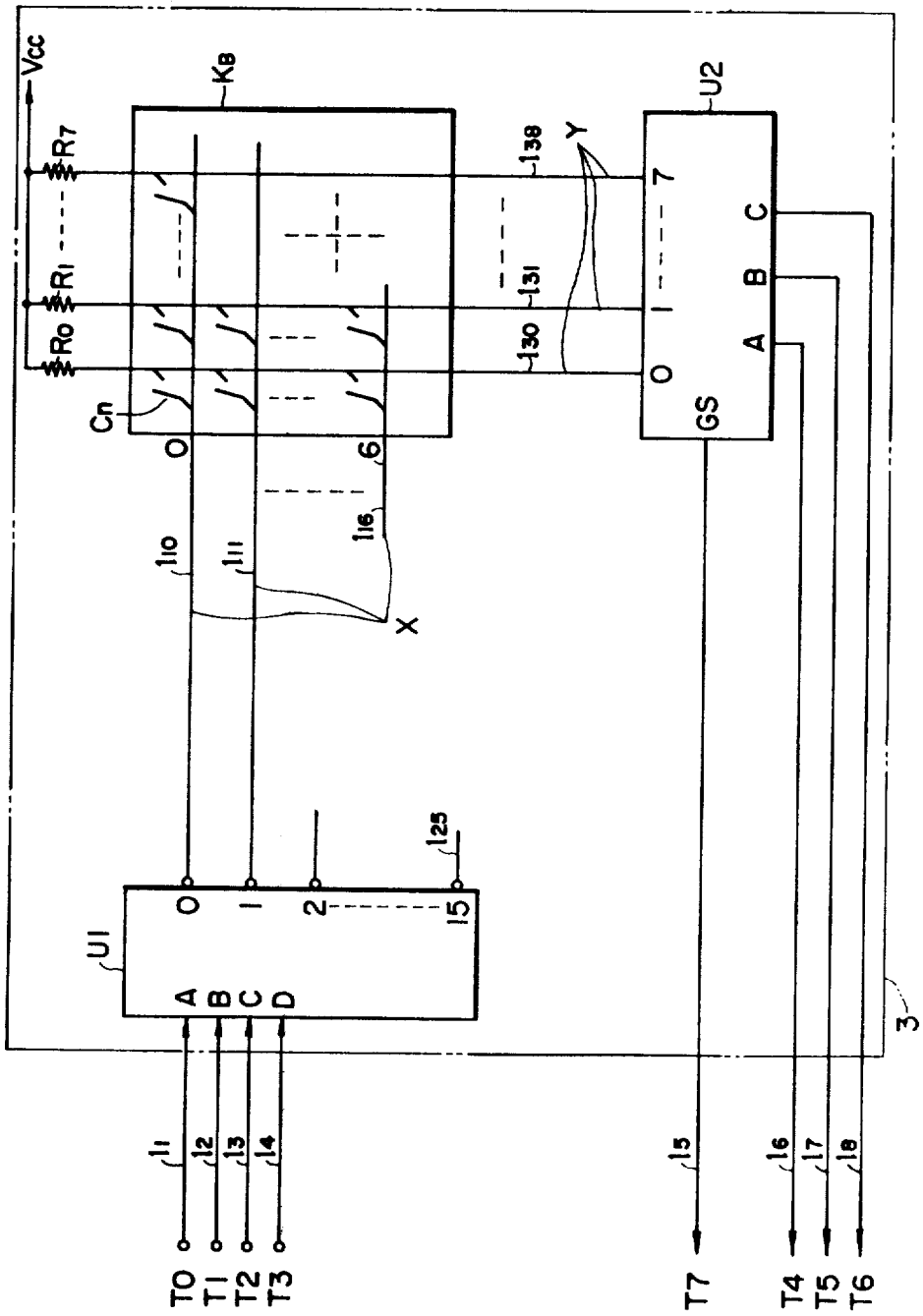
FIG. 6 is a block diagram of the key-input section.

This improvement will be understood from the detailed description taken with specific reference to FIG. 6.

The main section 1 (not shown) of the module is connected to the console 3 through lines $l_1$ to $l_8$, while the console 3 includes decoders $U_1$, $U_2$ and the key board KB.

The decoder $U_1$ has four input terminals A to D, so as to receive binary signals of 4 bits $T_0$ to $T_3$ from the main section 1. This decoder has 16 output terminals and is adapted to selectively output logical "0" to lines $l_{10}$ to $l_{25}$. For instance, if the input lines $l_1$ to $l_4$ are logical 1000, logical "0" is output only to the output line $l_{10}$, while logical "1" is output through all other output lines. Similarly, if the input is 0100, the logical "0" is output only through the output line $l_{11}$.

The key board KB has 6 (six) X lines $l_{10}$ to $l_{16}$ and 8 (eight) Y lines $l_{30}$ to $l_{38}$. Contacts Cn are formed at respective points where the X and Y lines intersect each other. Consequently, there are provided $6 \times 8$ (48) contacts. These contacts Cn are adapted to be actuated by key tops KP (see FIG. 1) of the key board, such that the X and Y lines corresponding to the depressed key top KP are connected to each other by the contact Cn.

The X lines $l_{10}$ to $l_{16}$ are connected to the output terminals of the decoder $U_1$, while Y lines $l_{30}$ to $l_{38}$ are connected to the power source through respective resistances $R_0$ to $R_8$. Consequently, the Y lines corresponding to the open contact Cn is maintained at a potential corresponding to logical "1".

The encoder $U_2$ has 8 (eight) input terminals 0 to 7 and 4 (four) output terminals A to C and GS. The output terminal GS is adapted to output a signal of logical "0" when a signal of logical "1" is input to any one of the eight input terminals, and to output a signal of logical "1" when all of the input terminals receive input signals of logical "1". In other words, an output signal from an AND circuit (not shown) in the encoder $U_2$ having 8 input terminals is applied to the output terminal GS.

Other output terminals A to C of the encoder $U_2$ are adapted to receive a signal obtained by encoding signals on the 8 input terminals 0 to 7 into binary digit. For instance, assuming that the logic condition of the input terminals 0 to 7 is 10000000, the output terminals A to C deliver 100, while, if the logic condition of the input terminals is 01000000, the output terminals A to C delivers 010. Similarly, a logical output 111 is available if the input logical condition is 00000010.

As can be seen from above description, the X lines of the key board KB are selected by the decoder and, therefore, are scanned by the binary signal on lines $l_1$ to $l_4$ leading from the main section 1. Thus, as a key top is depressed, a logical "0" is applied to the X line corresponding to the key top KP, and, only in that event, the corresponding Y line outputs a logical "0".

Thus, logical "0" is output only from the Y line corresponding to the depressed key. In other words, the Y line corresponding to the depressed key is discriminated from other Y lines by the logical output "0". This Y line information is encoded by the encoder $U_2$ to obtain binary Y line information of $T_4$ to $T_7$. The GS terminal, i.e. the terminal $T_7$ delivers a logical "0". Thus, whether the key is depressed or not is known from whether the terminal $T_7$ outputs "0" or "1". Consequently, by reading the information at the terminal $T_7$ at each time of the X line scanning, the key code can be ascertained immediately from the transmitted binary information of $T_0$ to $T_3$ and from the received informations of the terminals $T_4$ to $T_6$, at the instant at which the information available at the terminal $T_7$ becomes "0".

In the described example, the key code corresponding to the depressed key is obtained by an operation of the information on terminals $T_0$ to $T_6$. However, if necessary, it is possible to work out the $6 \times 8$ kinds of key codes by an encoder which receives signals from the terminals $T_0$ to $T_6$.

As has been described, inputting of 48 key information is possible only by 8 (eight) lines $T_0$ to $T_6$ and $T_7$ between the main section 1 and the console 3.

The above described input system does not necessitate any specific timing control circuit or timing signal generating circuit in the console 3.

According to the invention, there is provided an improved reproduction system for a cassette tape deck which is used as an auxiliary memory.

The recording of information in the tape deck is effected by a frequency modulation. For instance, the signal of logical "0" corresponds to a signal of 1.2 KHz in the tape deck, while the signal of logical "1" corresponds to a signal of 2.4 KHz.

Thus, the writing of information into the tape deck is effected by a logical circuit through a frequency modulation circuit, while the reading of the information out of the same is effected on the logical circuit through a demodulation circuit.

According to the conventional demodulation method, whether the information is of 2.4 KHz or 1.2 KHz is determined by comparing the time interval between the frequency-modulation data reproduced from the tape deck with a predetermined reference time interval. This method, however, has a disadvantage that it is adversely affected by the change in duty ratio attributable to the mechanical characteristics of the input tape deck and/or a frequency fluctuation.

Figure 7:
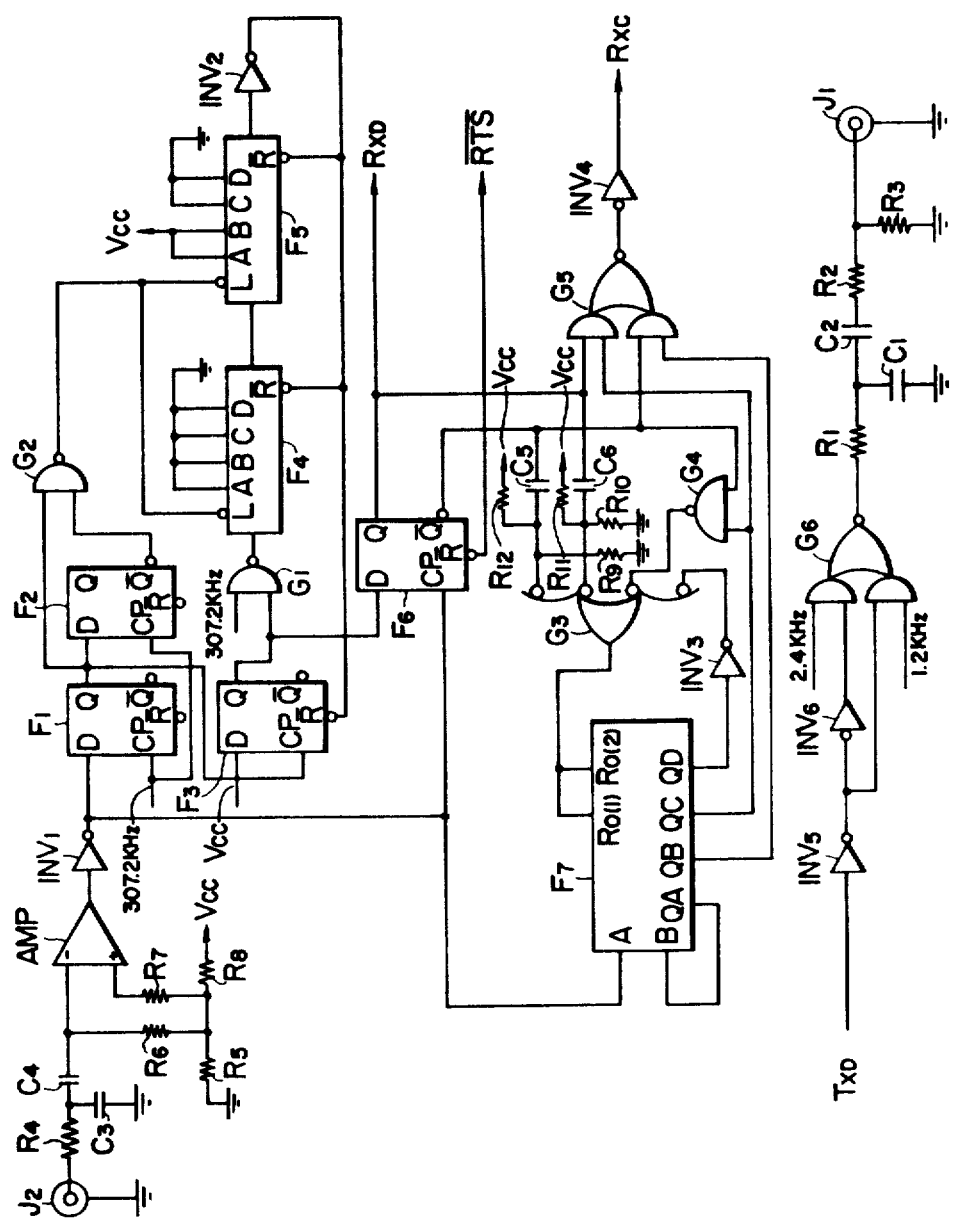
FIG. 7 is a circuit diagram of a modulation/demodulation circuit.
Figure 8:
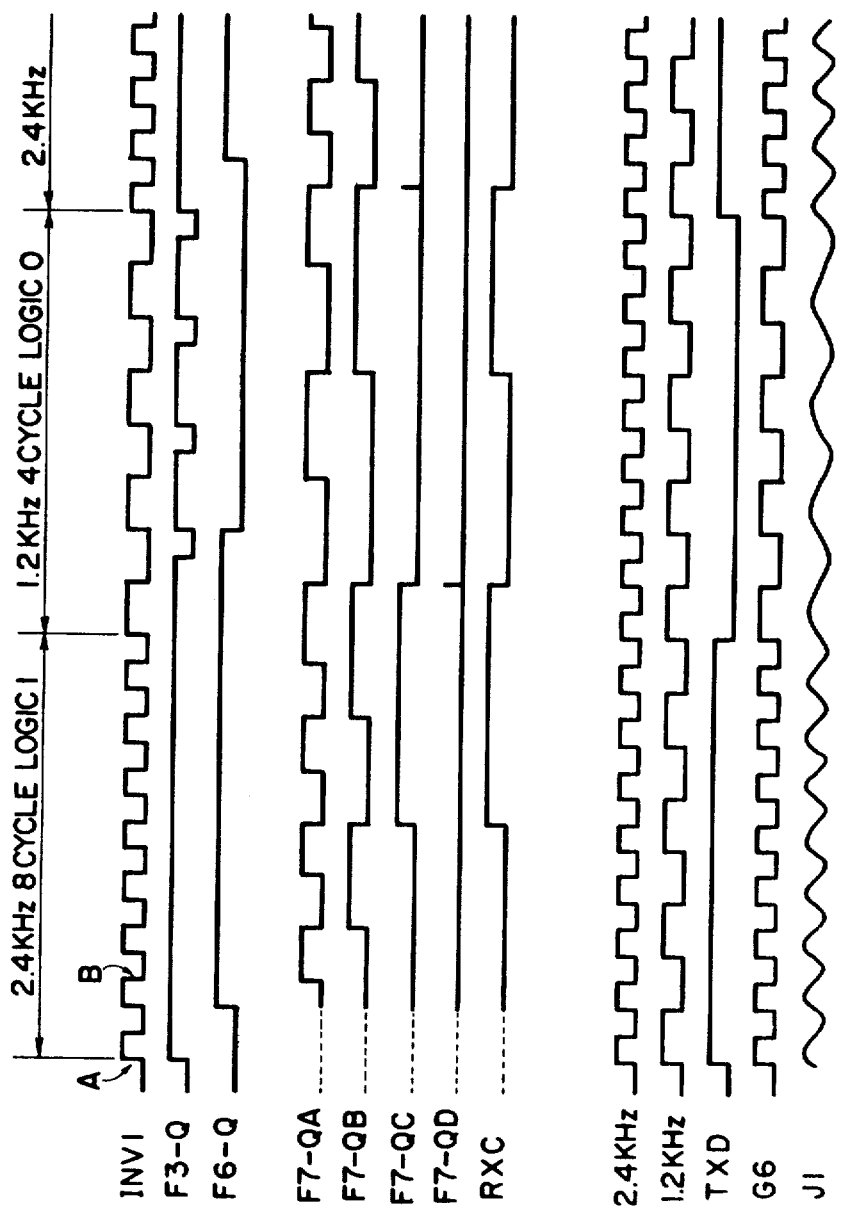
FIG. 8 shows the operational wave forms of signals in the circuit as shown in FIG. 7.

However, this problem is overcome in the system of the invention, as will be described hereinunder. FIG. 7 shows a practical circuit of this system, while FIG. 8 shows the time chart. Referring to FIG. 7, the signal reproduced from the tape deck is input through the jack $J_2$ to a low-band filter consisting of a resistance $R_4$ and a capacitor $C_3$. The output from the low-band filter is then delivered through a coupling capacitor $C_4$ to an amplifying circuit Amp adapted to be biased by a bias circuit consisting of resistance $R_5$ to $R_8$, and is inverted from sinusoidal wave to rectangular wave by an inverter $INV_1$. The frequency of the recorded signal is 1.2 KHz or 2.4 KHz, depending on whether the recorded signal is logical "0" or "1", so that the frequency of the output from the inverter $INV_1$ is always 1.2 KHz or 2.4 KHz. The output from the inverter $INV_1$ is input to a digital one-shot circuit consisting of D-type flip-flops $F_1$ to $F_3$, NAND gate $G_1$ and $G_2$ and counter circuits $F_4$ and $F_5$, and also to a read time setting circuit consisting of a D-type flip-flop circuit $F_6$, counter circuit $F_7$, NAND gate $G_4$, NOR gate $G_3$, NAD NOR gate $G_5$ and an inverter $INV_3$.

In the above mentioned digital time setting circuit, the D-type flip-flops $F_1$ to $F_3$ are adapted to read the input available at the input terminals D, at the time of rising up of a signal at clock terminals Cp. A signal of a frequency of 307.2 KHz, which is extremely high as compared with those (1.2 KHz or 2.4 KHz) of signals from the tape deck, is applied to the clock terminals Cp. The flip-flop $F_1$ outputs a pulse signal of 307.2 KHz at its output terminal Q, over a period substantially same as that in which the output from the inverter $INV_1$ is kept at logical "1", while the flip-flop $F_2$ outputs a pulse signal of 307.2 KHz at the inversed-phase terminal $\overline{Q}$, lagging by 1 clock time behind that. The NAND gate outputs a signal which is logical "0" over a period of 1 clock time from the time substantially coinciding with the time of rising up of the inverter $INV_1$, upon receipt of the output signals Q and Q from the flip-flop circuits $F_1$ and $F_2$. The NAND gate produces an output of logical "1" in the period other than specified above. The output from the gate $G_2$ is delivered to an initialize terminal L for the counters $F_4$ and $F_5$.

The terminal D of the flip-flop $F_3$ is kept at a potential Vcc corresponding to the logical "1", while the CP terminal is receiving the output Q from the flip-flop $F_1$.

The flip-flop $F_3$, which has been in the reset condition by an input of signal (described later) to its reset terminal $\overline{R}$, produces an output of logical "1" at its output sides, upon receipt of the output from the flip-flop $F_1$, which lags behind the rising up of the signal at the inverter $INV_1$ by almost one clock time.

As the flip-flop $F_3$ outputs logical "1", a signal of 307.2 KHz is applied to the counter $F_4$, through the gate $G_1$.

The counters $F_4$ and $F_5$ are constituted by hexadecimal counters and have control gates A to D having weights of 1,2, 4 and 8. The counter $F_4$ is a hexadecimal counter due to the grounding of the terminals A to D, while the counter $F_5$ is a 12-notation counter due to the grounding of the terminals C and D, so that the counter $F_5$ produces a carry 625 $\mu$s after the turning of the output from the $F_3$ to logical "1". The flip-flop $F_3$, counter $F_4$ and the counter $F_5$ are reset by this carry, through the inverter $INV_2$.

The above count time corresponds to a time length equal to 1.5 time the period of the 2.4 KHz signal.

When the signal of substantially 2.4 KHz is reproduced from the tape deck, an initializing signal is applied to the counter $F_5$ through the gate $G_2$, before the carry is generated by the counter $F_5$, so as to clear the content of the counter. Consequently, no reset signal is applied to the flip-flop $F_3$.

No load signal is delivered from the above-mentioned gate $G_2$ in the counter time, for the signal of substantially 1.2 KHz reproduced from the tape deck, so that the flip-flop is reset through the counter $F_5$. Consequently, the flip-flop $F_3$ produces a signal as shown in FIG. 8, in response to the output signal from the tape deck.

The output Q from the flip-flop $F_3$ is delivered to the terminal D of a flip-flop $F_6$, while the output from the inverter $INV_1$ is delivered to the clock terminal CP of the same flip-flop $F_6$. Consequently, a signal as shown in FIG. 3 is delivered from the output terminal Q of the flip-flop $F_6$.

The output from the flip-flop $F_6$ is a signal obtained by demodulating the signal recorded in the magnetic tape to logical "0" and "1".

A counter $F_7$ having output terminals $Q_A$, $Q_B$, $Q_C$ and $Q_D$ of weights of 1,2,4 and 8, as well as gates associated with the counter $F_7$, delivers a timing clock signal Rxc.

This timing clock Rxc is used for determining the reading time for the output Rxd from the flip-flop $F_6$, which has been converted into binary signal.

The digital one-shot used in the sampling as explained above can output pulses of a pulse width of a precision ten or more times as large as that obtained by conventional CR type one-shot multivibrator.

According to the invention, an improved display method for the alphameric display is adopted in the console 3.

Conventionally, LED (Light Emitting Diode) of 7 segments and the fluorescent display tube could display only the numerals 0 to 9 and letters A to F. This hexadecimal display is inconvenient in that, for example, it cannot perform the display of the assembler source statement. It is true that a 5×7 dot-matrix type display unit, capable of displaying English letters, has been proposed. However, this display unit requires a complicated hardware construction, due to the necessity of an encoder and, therefore, the display element itself is expensive.

In sharp contrast to the above, according to the invention, it is possible to display alphabets, numerals and specific letters, making use of a 7-segment display which is popularly used in commercially available desk-top calculators. Segment patters as similar as possible to designated symbols are used as the display symbol representative of these symbols.

The display of English letters, numerals and specific letters performed by the 7-segment display in accordance with the invention has the following advantages.

(1) Display elements are less expensive.

(2) Only a simple displaying external circuit is required. Namely, it is possible to directly work out a segment pattern from 1 byte of display data.

(3) Display elements are miniaturized.

Figure 9:
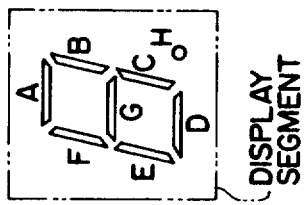
FIG. 9 shows a pattern of display on a display tube.

FIG. 9 shows the practical way of display of alphabet, numerals and specific letters by means of 7-segment display. The alphabet letters, numerals and specific letters and their display symbols by 7 segments are shown at the upper and the lower sections of rectangles. By way of reference, there is also shown a dot-7-segment.

Figure 10:
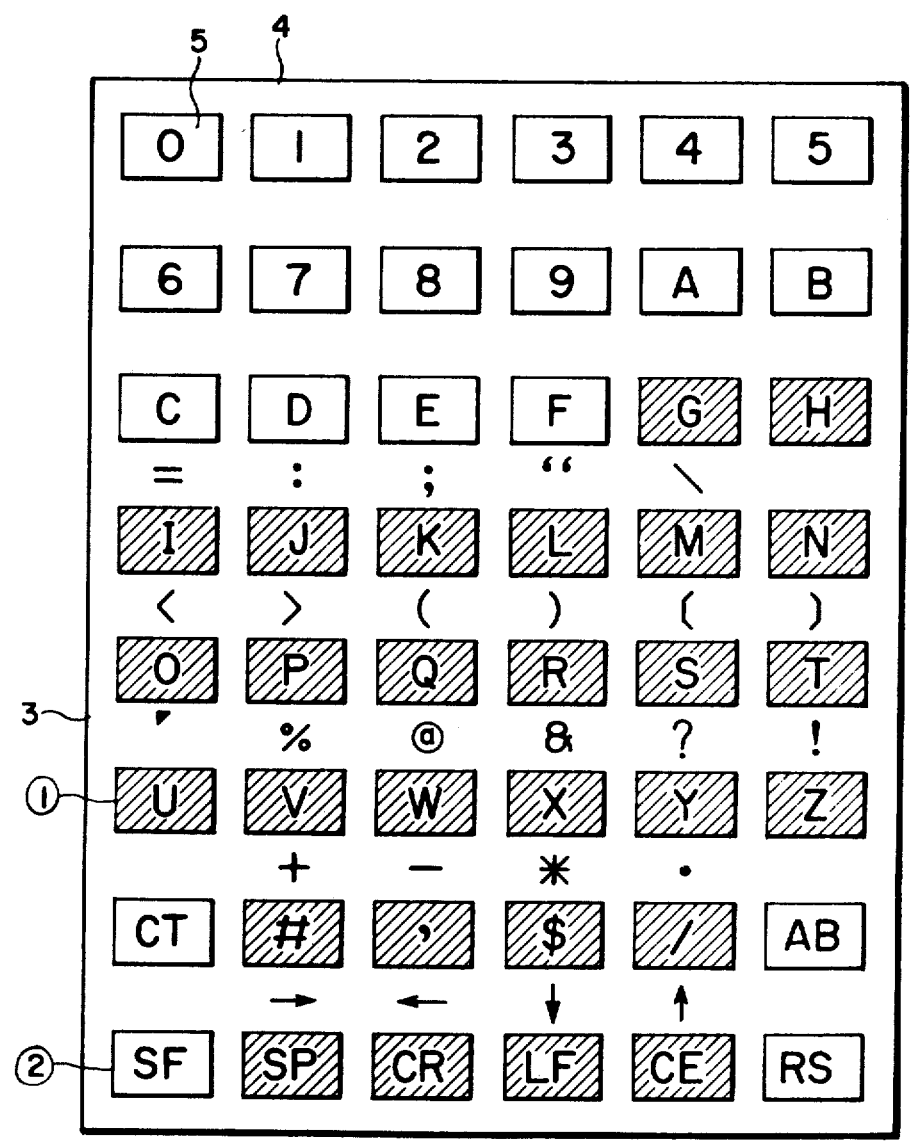
FIG. 10 is a plan view of a key board.

The keys of the pocketable console in accordance with the invention are arrayed for a better and simpler manipulation. In existing key arrangement, the keys for the alphabet letters are arrayed at random. Further, no specific consideration is made as to the arrangement of alphabet letters in relation with numeral keys (these numeral keys are arrayed in good order from 0 to 9). Thus, it took considerable time for the user to find out the letter key which is to be depressed, until the key arrangement becomes familiar to the user. FIG. 10 shows the plan of the key arrangement adopted in the pocketable console of the invention.

The key arrangement has a decorative plate 4 having a plurality of bores and key tops emerging from the bores. Each key top 5 carries a symbol representative of the corresponding input. Further symbols are printed on the decorative plate 4. As illustrated, numeral keys are arrayed from the left to the right and from the upper to the lower side, in an increasing order. At the same time, alphabet letters A,B,C . . . are arrayed in the same order as the dictionary.

This key arrangement considerably facilitates the hexadecimal operation, partly because the operators are accustomed to this key arrangement in his daily life and partly because the alphabet letters A, B, C . . . are arrayed following the numeral 9. This feature is considered as being a great advantage, because the hexadecimal digit is widely used in computers. Further, the hexadecimal keys (0–9, A-F) of the pocketable console have different color from that of other function keys such as for resetting, as will be detailed later, so as to facilitate the coding of the key.

Referring again to FIG. 10, the group of keys which are hatched as ① have a black symbol against light-blue key-top surface, while group of keys as one denoted by ② have black symbols on white key-top surface. Further, as stated above, specific letters are printed on the decorative plate. Thus, all of ASCII letters are fairly covered by this key arrangement.

Hereinafter, an explanation will be made as to other functional characteristics of the miniature computer in accordance with the present invention. Aboard interruption and timer interruption:

There are two kinds of interruption of NMI (Non Maskable Interruption) and IRQ (Interrupt Request) in the MPU having the product name HD46800. As a signal of rising wave form gets into the NMI terminal of the MPU, the processing of the MPU is necessarily changed to the NMI interruption processing sub-routine. On the other hand, as a rising wave-form signal is input to the IRQ terminal, the processing of the MPU is changed to IRQ processing routine, when the mask bit of the register (this shows the state) in the MPU assumes the state of "0". Thus, the aboard interruption and the timer interruption make use of NMI interruption, respectively.

Figure 12A:
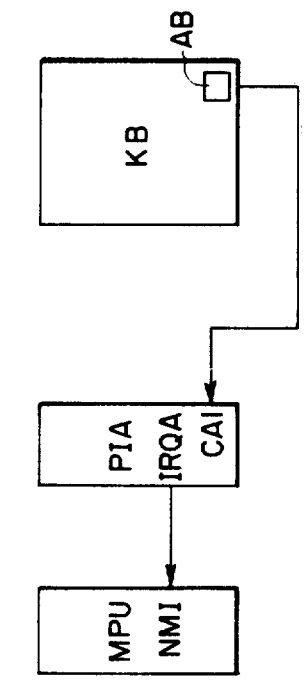
FIGS. 12(a) and 12(b) are circuit diagrams for explaining other interruption circuits, and FIGS. 13a and 13b constitute a circuit diagram and characteristic chart, respectively, for explaining the connection of a power supply to the printed substrate.

As shown in FIG. 12(a), the aboard interruption is performed by at first inputting the signal, which is input by the AB key of the key board KB, to a terminal CA1 of the PIA, and delivering an output from a terminal IRQA to the NMI terminal of the MPU. As the CA1 terminal receives the signal, the bit of the PIA corresponding to the register CA1 becomes "1". A monitor judges this flag and turns the bit of the register corresponding to the IRQA terminal to "0" (Usually, this bit is kept as "1"), so as to cause the NMI interruption.

Figure 12B:
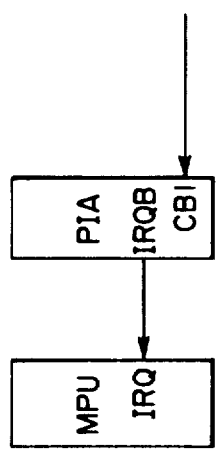

On the other hand, as will be seen also from FIG. 12(b) illustrating the timer interruption, the 1.2 KHz clock generated by the CT block as shown in FIG. 2 is delivered to a CB1 terminal of the PIA. The CB1 terminal also has a bit corresponding to the register, as is the case of the CA1 terminal. As a clock of High level is received by CA1, this bit is changed to "1", so as to allow the IRQ interruption through the IRQB terminal in accordance with the judgement by the program.

Since the NMI interruption cannot be stopped, it has been used conventionally only for most preferential interruption such as that for power failure in the system.

According to the invention, since the aboard interruption is made by NMI interruption via PIA, it is possible to stop the interruption of the MPU to the NMI terminal by means of the program, and to delay the timing of the interruption.

According to this system, the above stated advantage is utilized in such a manner that the aboard interruption is rejected during the timer interruption processing (counting is commenced as the interruption is made) after the generation of the timer interruption in the main system, and is allowed only after the completion of the timer processing.

Figure 11:
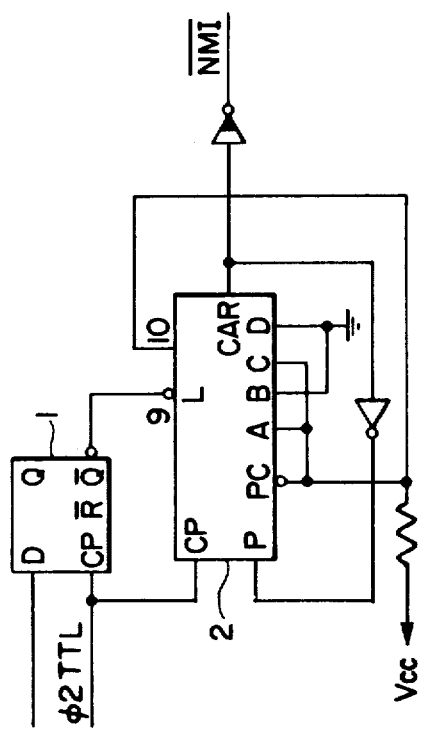
FIG. 11 is a circuit diagram and time chart of an interrupt generation circuit.
Figure 11:
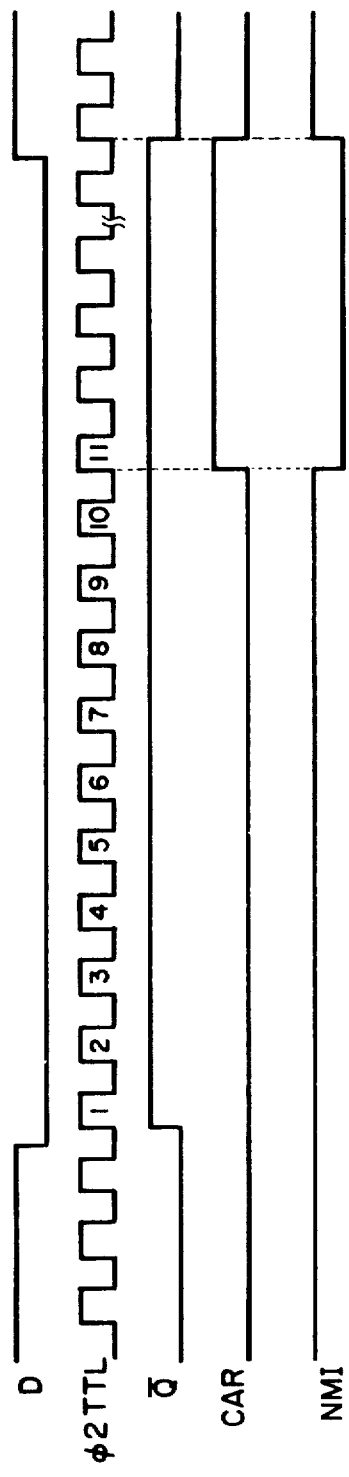

1-instruction Trace Interruption Generating Circuit:

FIG. 11 shows a 1-instruction trace interruption (NMI) generating circuit as well as its time chart, incorporated in the miniature computer of the invention.

This circuit is intended for generating NMI interruption to the MPU in accordance with the program. As the D terminal of D-type flip-flop 71 is turned to Low level, the output $\bar{Q}$ from the same flip-flop is turned to High level, in symchronization with the rising of the $\phi_2$ TTL clock of the same phase as the MPU driving clock $\phi_1$. This output $\bar{Q}$ and $\phi_2$ TTL clock are delivered to terminals L and CP of a synchronous 4bit counter (product name HD74161) 72. The counting is commenced at an instant at which the output $\bar{Q}$ comes to assume the High level, and the CAR terminal of the 11th period comes to take High level.

As the terminal D of the D-type flip-flop 71 is returned to the state of High level by the program processing, the output $\bar{Q}$ comes to assume Low level in synchronization with the rising up of the $\phi_2$ TTL. At this moment, the CAR terminal comes to assume the Low level. Since the NMI interruption to the MPU is effectfed at the time of falling down, an output CAR (L carry) having passed through an inverter is used as the NMI signal.

The above described circuit, which makes use of the function of the L terminal of the counter, has a simplified structure including latches the number of which is smaller by one than those in the conventional circuits. Protection of LSI on Printed Substrate Against Breakage:

In the miniature computer in accordance with the invention, a number of large-scale integrated circuits (LSI) are mounted on the printed substrate 2. If the power supply terminals (for instance S,T) are connected to the power source DC voltage in the reverse polarity to the designated one, these LSIs may be ruptured. To avoid this, as shown in FIG. 13-a, a diode K is connected between the power supply terminals S,T, in the predetermined polarity, on the printed substrate.

Figure 13A:
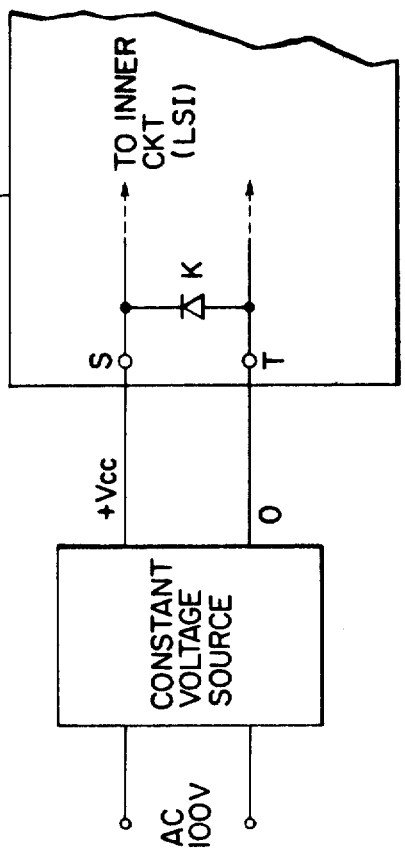
Figure 13B:
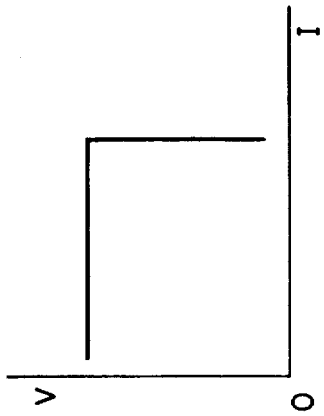

By way of reference, FIG. 13-b shows the I-V characteristics of the power source. By mounting a diode between power supply terminals on the printed substrate carrying a number of LSIs, the incorporating of safety device such as a fuse in the power input circuit, which has been indispensable, can fairly be eliminated. The safe condition can easily be recovered, even when the printed substrate is connected in the incorrect polarity, by simply correcting the connection of the substrate to the power source, without requiring troublesome replacement of the fuse.

As has been described, according to the invention, there is provided a miniature computer capable of treating a symbolic language. It is to be noted that the realization of this miniature computer is entirely due to the realization of ROMLSi for the assembly program and a miniaturized console.

What is claimed is:

1. A miniature computer comprising
   a main section including a central processor, a read only memory for storing a program to control said central processor, and a random access memory connected to said central processor for reading out and writing in data under control of said central processor, said central processor, said read only memory and said random access memory being interconnected by a common bus and being mounted together in a compact housing; and a hand-held control device mechanically separated from and electrically connected by cable means to said main section, said control device including a controlling keyboard for providing manual input command signals to said main section and display means for displaying said manual input command signals, said controlling keybord having keys corresponding to the numerals of 0 to 9 and the alpha characters of A to Z for inputting data in the form of symbolic language command signals according to an assembler program; wherein said read only memory stores an assembler program for converting said symbolic language command signals to corresponding machine language control signals; and wherein said display means includes a segment driver circuit for displaying said symbolic language data inputted via said keys.

2. A miniature computer according to claim 1, wherein said control device comprises a keyboard matrix having row lines and column lines disposed in matrix form and means to connect said column lines to said row lines selectively under depression of said keys; decoder means for producing a timing signal on a selected one of said column lines in response to a binary coded input signal supplied by said main section through said cable means; and encoder means for transmitting a binary coded output signal through said cable means to said main section in response to the timing signal transmitted on said selected one of said column lines under depression of a selected one of said keys, whereby a combination of said binary coded input and output signals is provided to said main section as a binary coded signal corresponding to the depressed key.

3. A miniature computer according to claim 2, wherein said control device includes a circuit for generating a voltage to energize said display means based on a voltage received from said main section.

4. A miniature computer according to claim 1, further including timer processing means for generating a periodic timer processing signal, means for generating a nonmaskable interrupt signal (NMI) to be delivered to said central processor under predetermined conditions, and delay means for delaying said nonmaskable interrupt signal (NMI) to be delivered to said central processor until the completion of said timer processing signal.

5. A miniature computer according to claim 1, wherein said delay means includes a counter means for delivering said nonmaskable interrupt signal to said central processor.

6. The miniature computer according to claim 1, further including a pair of power supply terminals and protection means comprising a diode connected between said power supply terminals.

* * * * *